United States Patent [19]
Maeda

[11] Patent Number: 6,060,765
[45] Date of Patent: May 9, 2000

[54] SEMICONDUCTOR DEVICE AND A METHOD OF MANUFACTURING THE SAME

[75] Inventor: Atsushi Maeda, Hyogo, Japan

[73] Assignee: Mitsubishi Denki Kabushiki Kaisha, Tokyo, Japan

[21] Appl. No.: 09/111,882

[22] Filed: Jul. 8, 1998

[30] Foreign Application Priority Data

Jan. 5, 1998 [JP] Japan .................................. 10-000019

[51] Int. Cl.[7] ...................................................... H01L 29/72
[52] U.S. Cl. ........................... 257/635; 257/388; 257/412; 257/632; 257/647; 438/151; 438/738
[58] Field of Search ..................................... 257/387, 388, 257/412, 632, 635, 647; 438/151, 738

[56] References Cited

U.S. PATENT DOCUMENTS 5,631,484  5/1997  Tsoi et al. ................................ 257/635

FOREIGN PATENT DOCUMENTS 4-109654    4/1992   Japan .
7-135183    5/1995   Japan .
8-330417   12/1996   Japan .
9-007970    1/1997   Japan .

*Primary Examiner*—Edward Wojciechowicz
*Attorney, Agent, or Firm*—McDermott, Will & Emery

[57] ABSTRACT

A semiconductor device is provided which is improved to be capable of stably forming a contact hole. A stopper film is provided on a gate electrode. An interlayer insulating film is provided on a semiconductor substrate to cover the gate electrode. The interlayer insulating film and the stopper film are penetrated by a first contact hole which exposes a surface of the gate electrode. The interlayer insulating film is provided with a second contact hole for exposing a surface of an impurity diffusion layer. The stopper film is formed of a material higher in etch selectivity than the interlayer insulating film.

13 Claims, 11 Drawing Sheets

6,060,765

SEMICONDUCTOR DEVICE AND A METHOD OF MANUFACTURING THE SAME

BACKGROUND OF THE INVENTION

1. Field of the Invention

The present invention generally relates to a semiconductor device, and more particularly to a semiconductor device improved so that a contact hole can be formed stably. The present invention also relates to a method of manufacturing such a semiconductor device.

2. Description of the Background Art

A conventional method of manufacturing semiconductor devices will now be described together with a disadvantage thereof. Referring to FIG. 20, a LOCOS oxidation film 2 as an element isolating region is provided in a surface of a silicon substrate 1. LOCOS oxidation film 2 is provided for electrically isolating an element region from another element region. An impurity diffusion layer 3 is provided at an active region. A polysilicon interconnection (gate electrode) 4 is provided on LOCOS oxidation film 2. An interlayer insulation film 5 is provided on silicon substrate 1 to cover polysilicon interconnection 4. Provided in interlayer insulating film 5 are a contact hole 6a for exposing a surface of polysilicon interconnection 4 and a contact hole 6b for exposing a surface of impurity diffusion layer 3.

The depth of contact hole 6a is different from that of contact hole 6b. Thus, if an etching condition is set according to contact hole 6b for exposing a surface of impurity diffusion layer 3, a surface of polysilicon interconnection 4 is removed at a portion of contact hole 6a for exposing a surface of polysilicon interconnection 4.

Referring to FIG. 21, contact holes 6a and 6b are internally covered with a barrier metal layer 7 of e.g. Ti/TiN formed by sputtering, and lamp annealing is then applied so that barrier metal layer 7 reacts with silicon substrate 1 or polysilicon interconnection 4. A TiSi$_2$ layer 8 is thus formed at a surface of polysilicon interconnection 4 and a surface of impurity diffusion layer 3.

Since polysilicon interconnection 4 is removed at a portion of contact hole 6a, the film thickness of polysilicon interconnection 4 must be increased with consideration for the reduction of the film thickness of polysilicon interconnection 4 due to the removal. Accordingly, conventional devices cannot reduce step. Increasing the film thickness of polysilicon interconnection 4 further increases the depth difference between contact holes 6a and 6b.

Referring to FIG. 22, interconnection layer 6a, 6b is formed to obtain a semiconductor device.

Referring to FIG. 23, for a conventional device, when the registration for forming contact hole 6b is displaced and contact hole 6b thus overlaps with element isolating region 2, an end of LOCOS oxide film 2 is etched simultaneously in overetching the interlayer insulating film 5 to expose a surface of silicon substrate 1.

Referring to FIG. 24, forming a conductive layer 9 while a surface of silicon substrate 1 is exposed causes leakage into silicon substrate 1. Thus, the distance between the end of LOCOS oxide film 2 and contact hole 6b cannot be reduced in the conventional device, disadvantageously resulting in preventing microfabrication of the device.

SUMMARY OF THE INVENTION

The present invention is made to solve such disadvantages as described above and contemplates a semiconductor device improved to be capable of stably forming a contact hole.

The present invention also contemplates a semiconductor device improved to be capable of microfabrication.

A semiconductor device in one aspect includes a semiconductor substrate. An element isolating region for isolating an active region from another active region is provided on the semiconductor substrate. The active region is provided with an impurity diffusion layer. A gate electrode is provided on the element isolating region. A stopper film is provided on the gate electrode. An interlayer insulating film is provided on the semiconductor substrate to cover the gate electrode. A first contact hole exposing a surface of the gate electrode penetrates the interlayer insulating film and the stopper film. A second contact hole for exposing a surface of the impurity diffusion layer is provided in the interlayer insulating film. The stopper film is formed of a material which is higher in etch selectivity than the interlayer insulating film.

A semiconductor device in a second aspect includes a semiconductor substrate. An element isolating region for isolating an active region from another active region is provided on the semiconductor substrate. The active region is provided with an impurity diffusion layer. A gate electrode is provided on the element isolating region. A stopper film is provided on the semiconductor substrate to cover the gate electrode and the impurity diffusion layer. An interlayer insulating film is provided on the semiconductor substrate with the stopper film interposed therebetween. A first contact hole which exposes a surface of the impurity diffusion layer penetrates the interlayer insulating film and the stopper film. The stopper film is formed of a material which is higher in etch selectivity than the interlayer insulating film.

In a semiconductor device in a third aspect, a second contact hole which exposes a surface of the gate electrode penetrates the interlayer insulating film and the stopper film.

In a semiconductor device in a fourth aspect, the element isolating region is formed of LOCOS oxide film provided at a surface of the semiconductor substrate.

In a semiconductor device in a fifth aspect, the element isolating region is formed of a trench formed in a surface of the semiconductor substrate, and of an oxide film buried in the trench.

In a semiconductor device in a sixth aspect, the gate electrode is formed of a polycide of refractory metal.

In a semiconductor device in a seventh aspect, a silicide of refractory metal is formed on the gate electrode and the impurity diffusion layer.

In a semiconductor device in an eighth aspect, a gate electrode is formed on an element isolating region.

A semiconductor device in a ninth aspect includes a semiconductor substrate. A gate electrode is formed on the semiconductor substrate. A pair of impurity diffusion layers is formed in a surface of the semiconductor substrate such that the impurity diffusion layers sandwich the gate electrode. A stopper film is provided on the semiconductor substrate to cover the gate electrode and the impurity diffusion layer. An interlayer insulating film is provided on the semiconductor substrate to cover the stopper film. The interlayer insulating film and the stopper film are penetrated by a shared contact hole which simultaneously exposes a portion of the surface of the gate electrode and a portion of the surface of the impurity diffusion layer. The stopper film is formed of a material which is higher in etch selectivity than the interlayer insulating film.

An invention in a tenth aspect relates to a method of manufacturing a semiconductor device having a contact hole provided in an interlayer insulating film. An element isolating region for isolating an active region from another active region is formed on a semiconductor substrate. An impurity diffusion layer is formed at the active region. A gate electrode is formed on the element isolating region. A stopper film formed of a material higher in etch selectivity than the interlayer insulating film is formed on the semiconductor substrate to cover the gate electrode and the impurity diffusion layer. The interlayer insulating film is formed on the semiconductor substrate to cover the stopper film. A first contact hole for exposing a surface of the stopper film is formed in the interlayer insulating film adjacent to a boundary between the element isolating region and the active region such that the first contact hole is located over the impurity diffusion layer. The stopper film exposed by the first contact hole is etched away to expose a surface of the impurity diffusion layer.

A semiconductor device manufacturing method in an eleventh aspect includes forming the contact hole less than 0.2 $\mu$m distant from a boundary of the element isolating region and the active region.

A semiconductor manufacturing method in a twelfth aspect includes forming a second contact hole for exposing a surface of the stopper film simultaneously with formation of the first contact hole such that the second contact hole is located in the interlayer insulating film over the gate electrode.

In a semiconductor device manufacturing method in a thirteenth aspect includes forming the element isolating region of a LOCOS oxide film provided at a surface of the semiconductor substrate.

A semiconductor device manufacturing method in a fourteenth aspect includes forming the element isolating region of a trench formed in a surface of the semiconductor substrate, and of an oxide film buried in the trench.

The semiconductor device in the first aspect has a stopper film formed of a material higher in etch selectivity than an interlayer insulating film to effectively prevent a surface of a gate electrode from being scraped.

The semiconductor device in the second aspect has a stopper film formed of a material higher in etch selectivity than an interlayer insulating film to effectively prevent a surface of a gate electrode from being scraped.

The semiconductor device in the third aspect can effectively reduce the distance between an element isolating region and a second contact hole as desired.

The semiconductor device in the fourth aspect has an element isolating region formed of LOCOS oxide film and thus it can be effectively formed by general LOCOS methods.

The semiconductor device in the fifth aspect has an element isolating region formed by trench separation and thus it can be readily formed by general etching means.

The semiconductor device in the sixth aspect has a gate electrode formed of a polycide of refractory metal to effectively obtain a gate electrode of low resistance.

The semiconductor device in the seventh aspect has a silicide of refractory metal formed on a gate electrode and on an impurity diffusion layer to effectively contemplate low resistance.

The semiconductor device in the eighth aspect has a gate electrode formed on an element isolating region to maximize height difference to also effectively prevent a surface of the gate electrode from being scraped.

The semiconductor device in the ninth aspect effectively provides that semiconductor device with a shared contact in which a surface of a gate electrode is not scraped.

The semiconductor manufacturing method in the tenth aspect effectively provides a semiconductor device in which a surface of a gate electrode is not scraped.

The semiconductor device in the eleventh aspect has a contact hole formed less than 0.2 $\mu$m distant from a boundary of an element isolating region and an active region to effectively contemplate microfabrication thereof.

The semiconductor device manufacturing method in the twelfth aspect includes forming over a gate electrode a second contact hole exposing a surface of a stopper film, to effectively obtain a semiconductor device in which a surface of the gate electrode is not scraped.

The semiconductor device manufacturing method in the thirteenth aspect includes forming an element isolating region of LOCOS oxide film to allow application of general LOCOS method.

The semiconductor device manufacturing method in the fourteenth aspect includes forming an element isolating region by trench separation to allow general etching techniques to be applied in forming it.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described with reference to the drawings.

First Embodiment

Figure 1:
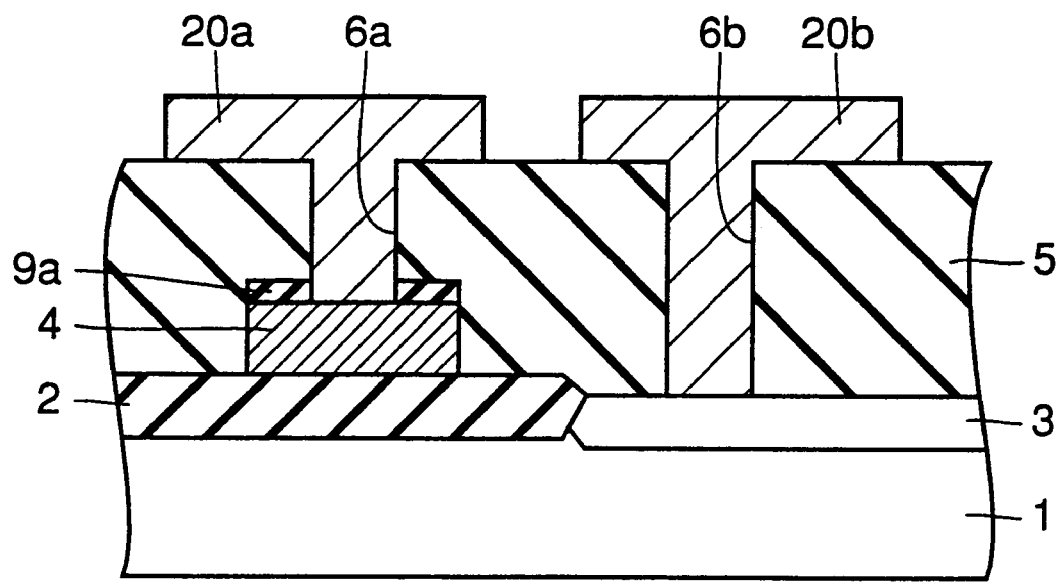
FIG. 1 is a cross section of a semiconductor device according to a first embodiment.
Figure 2:
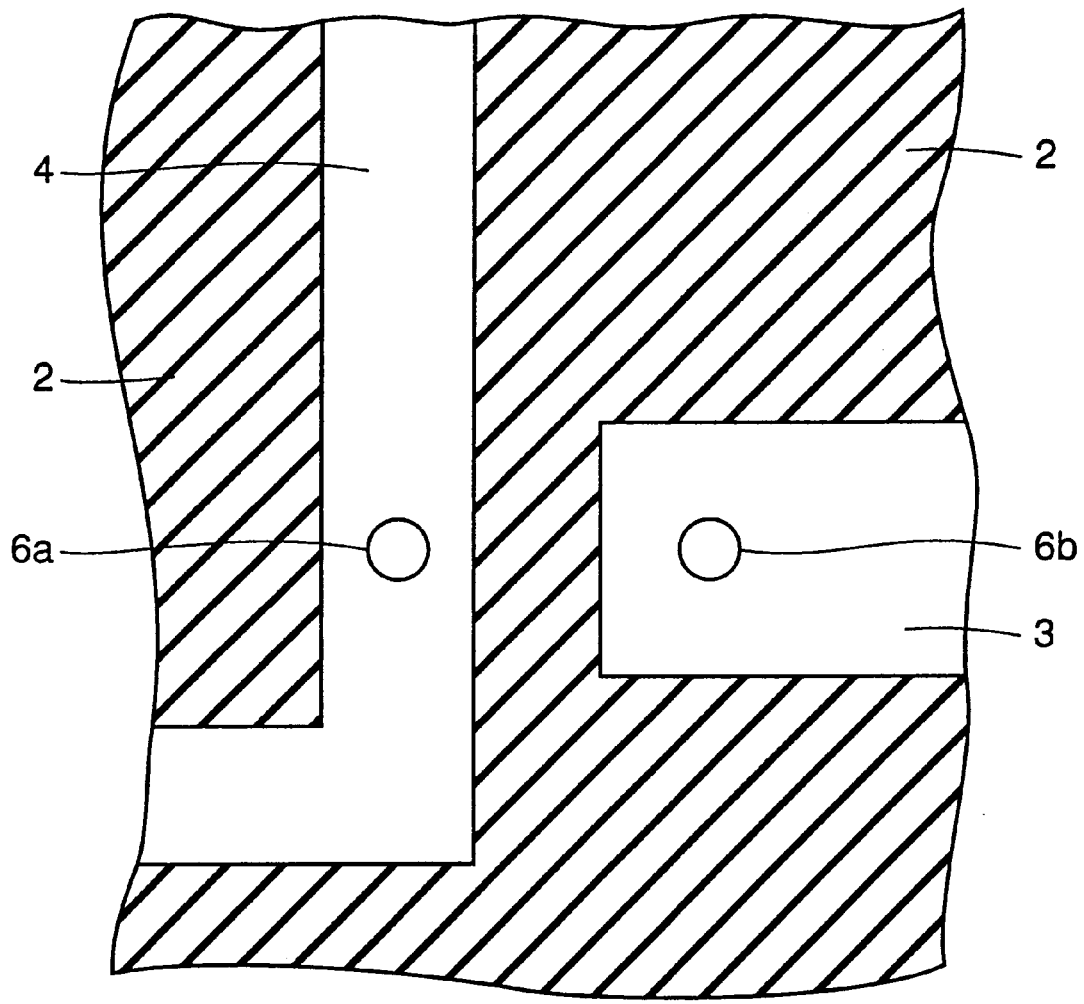
FIG. 2 is a plan view of the semiconductor device shown in FIG. 1.

FIG. 1 is a cross section of a semiconductor device according to a first embodiment and FIG. 2 is a plan view thereof.

Referring to these figures, the semiconductor device according to the first embodiment includes a silicon substrate 1. Provided on silicon substrate 1 is a LOCOS oxide film 2 as an element isolating region for isolating an active region from another active region. The active region is provided with an impurity diffusion layer 3. A gate electrode 4 is provided on LOCOS oxide film 2. A stopper film 9a is provided on gate electrode 4. An interlayer insulating film 5 is provided on silicon substrate 1 to cover gate electrode 4. Interlayer insulating film 5 and stopper film 9a are penetrated by a first contact hole 6a which exposes a surface of gate electrode 4. Provided in interlayer insulating film 5 is a second contact hole 6b for exposing a surface of impurity diffusion layer 3. Through contact hole 6a, an interconnection layer 20a is connected to gate electrode 4. Through contact hole 6b, an interconnection layer 20b is connected to impurity diffusion layer 3.

A method of manufacturing the semiconductor device according to the first embodiment will now be described.

Figure 3:
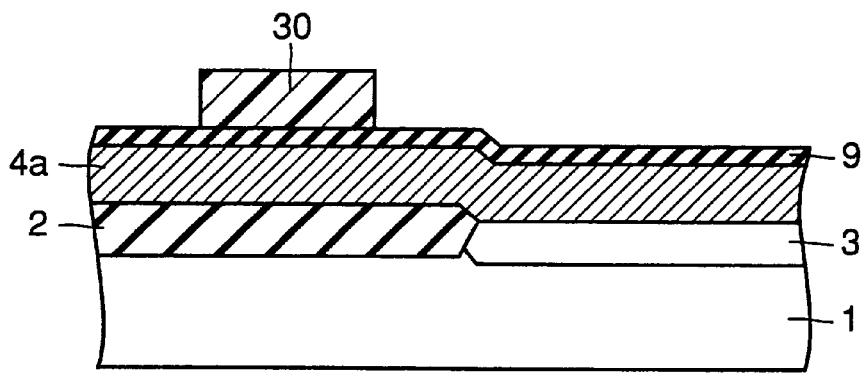
FIGS. 3–7 are cross sections of the semiconductor device according to the first embodiment in first to fifth steps of a method of manufacturing the semiconductor device according to the first embodiment, respectively.

Referring to FIG. 3, silicon substrate 1 is preferred which has LOCOS oxide film 2 formed thereon. A material layer 4a which will serve as a gate interconnection is formed on silicon substrate 1. Stopper film 9 formed of $Si_3N_4$ film is formed on material layer 4a. Formed on stopper film 9 is a resist pattern 30 which has the pattern of the gate interconnection.

Figure 4:
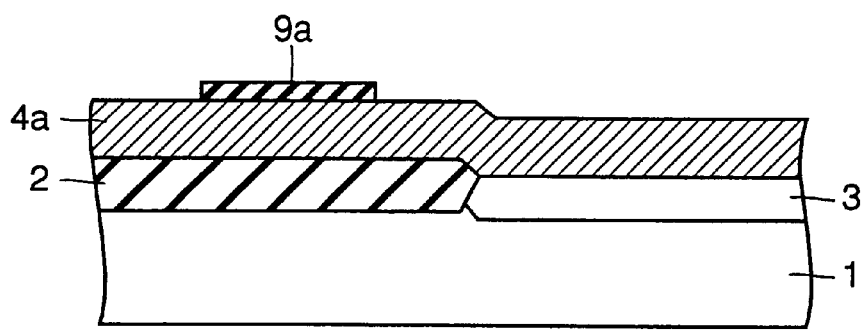

Referring to FIGS. 3 and 4, resist pattern 30 is used as a mask to etch $Si_3N_4$ film 9 and thus form a pattern 9a of $Si_3N_4$ which is then used as a mask to etch material layer 4a and thus form gate electrode 4. Resist pattern 30 may also be used as a mask to simultaneously etch $Si_3N_4$ film 9 and material layer 4a to form gate electrode 4.

Figure 5:
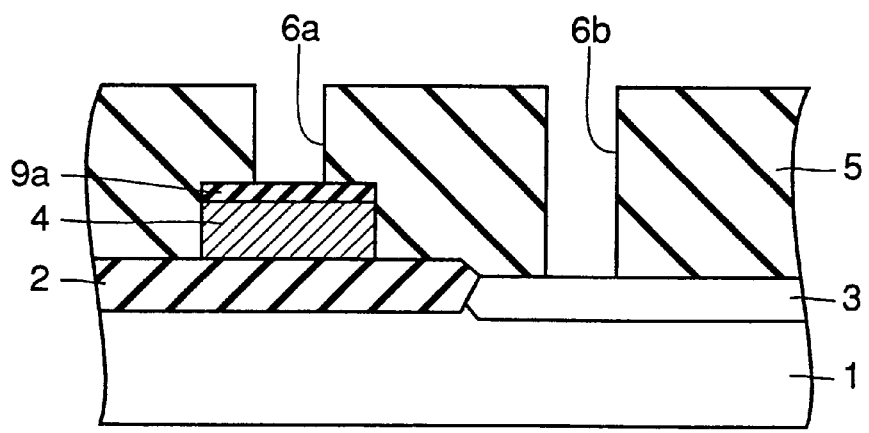

Referring to FIG. 5, an interlayer insulating film 5 is formed on silicon substrate 1 such that interlayer insulating film 5 covers the gate electrode 4 thus formed.

Referring to FIG. 5, the first contact hole 6a for exposing a surface of gate electrode 4 and the second contact hole 6b for exposing a surface of impurity diffusion layer 3 are formed in interlayer insulating film 5. In forming the first contact hole 6a, stopper film 9a acts as a stopper to prevent the surface of gate electrode 4 from being scraped.

Figure 6:
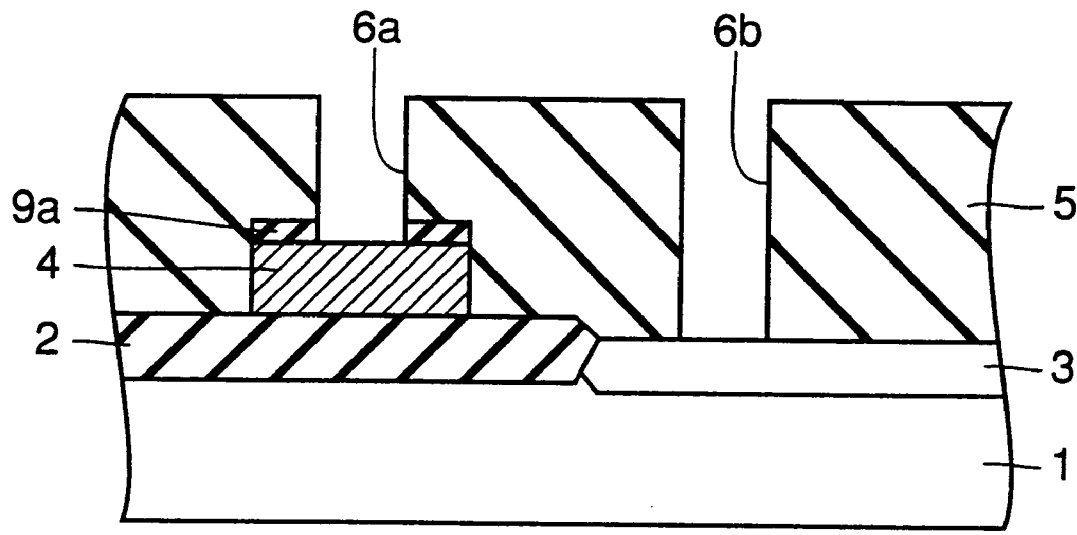

Referring to FIGS. 5 and 6, the stopper film 9a which remains at the bottom of the first contact hole 6a is etched to expose a surface of gate electrode 4.

Figure 7:
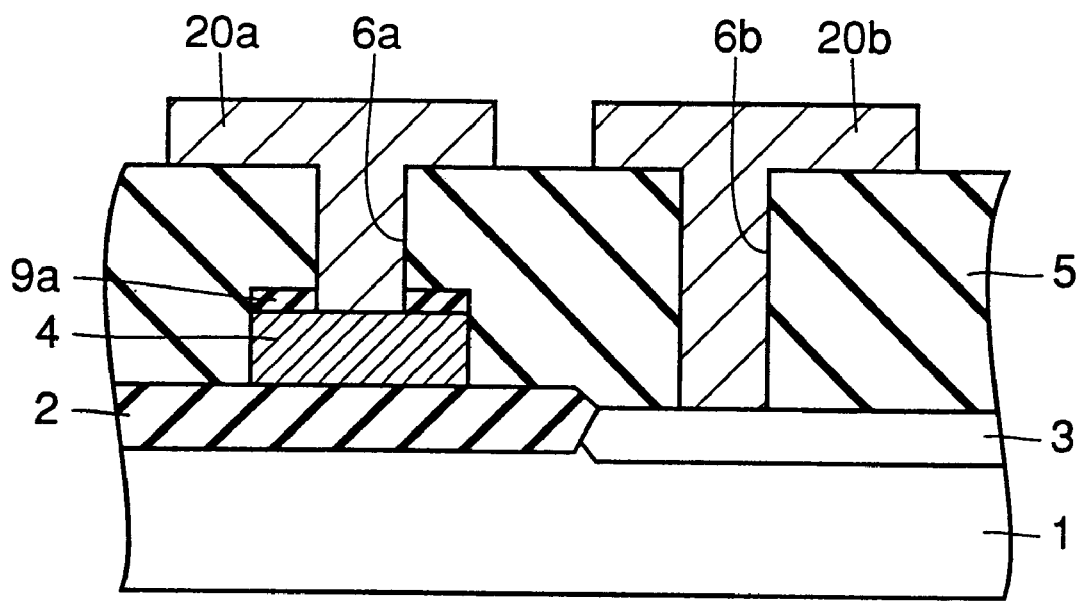

Referring to FIG. 7, an interconnection layer 20a connected to gate electrode 4 via the first contact hole 6a and an interconnection layer 20b connected to impurity diffusion layer 3 via the second contact hole 6b are formed to obtain the semiconductor device.

Referring to FIG. 5, $Si_3N_4$ which forms stopper film 9a has a larger film stress than $SiO_2$-based films and might disadvantageously affect the underlying elements. Accordingly, a $SiO_2$ or SiON film of approximately several hundreds Å may be provided under stopper film 9a.

Material layer 4a serving as the gate electrode may be of a single-layer film of polysilicon, or a multilayer film of polysilicon and a silicide of refractory metal, such as Mo, W, Ti, which is referred to as a polycide. The conventional technique of forming gate electrode 4 of a multilayer film of polysilicon and a silicide of refractory metal disadvantageously causes contact resistance to be increased if the silicide in the first contact hole 6a is removed due to the overetching in forming the first contact hole 6a. In contrast, a stopper film 9a formed on gate electrode 4 as a stopper against etching, as in the first embodiment, prevents removal of the silicide in the first contact hole 6a.

Second Embodiment

Figure 8:
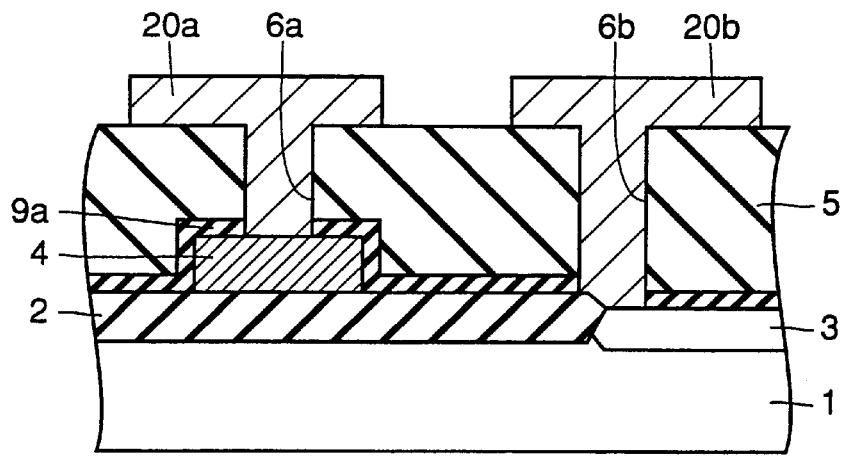
FIG. 8 is a cross section of a semiconductor device according to a second embodiment.

FIG. 8 is a cross section of a semiconductor device according to a second embodiment. The semiconductor device includes a silicon substrate 1. Provided on silicon substrate 1 is a LOCOS oxide film 2 for isolating an active region from another active region. The active region is provided with an impurity diffusion layer 3. A gate electrode 4 is provided on LOCOS oxide film 2. A stopper film 9a is provided on the entire surface of silicon substrate 1 such that stopper film 9a covers gate electrode 4 and impurity diffusion layer 3. An interlayer insulating film 5 is provided on silicon substrate 1 with stopper film 9a interposed therebetween. Interlayer insulating film 5 and stopper film 9a are penetrated by a contact hole 6b which exposes a surface of impurity diffusion layer 3. Interlayer insulating film 5 and stopper film 9a are also penetrated by a contact hole 6a which exposes a surface of gate electrode 4.

A method of manufacturing the semiconductor device according to the second embodiment will now be described.

Figure 9:
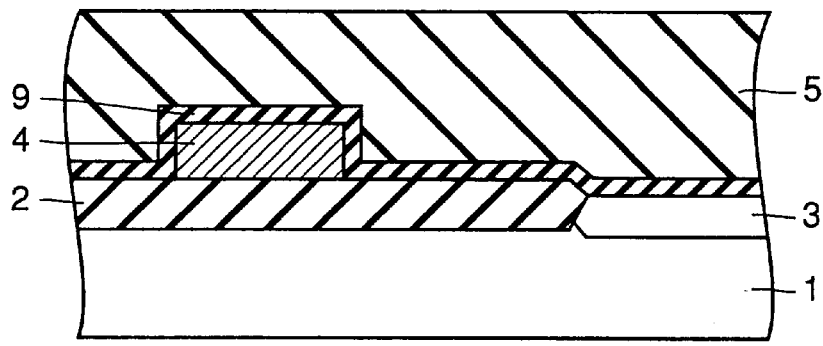
FIGS. 9–12 are cross sections of the semiconductor device according to the second embodiment in first to fourth steps of a method of manufacturing the semiconductor device according to the second embodiment, respectively.

Referring to FIG. 9, LOCOS oxide film 2 an impurity diffusion layer 3 are formed in a surface of silicon substrate 1. Gate electrode (polysilicon electrode) 4 is formed on LOCOS oxide film 2. Stopper film 9 of e.g. $Si_3N_4$ is formed on the entire surface of silicon substrate 1 such that stopper film 9 covers gate electrode 4. Interlayer insulating film 5 is formed on the entire surface of silicon substrate 1 with stopper film 9 interposed therebetween.

Figure 10:
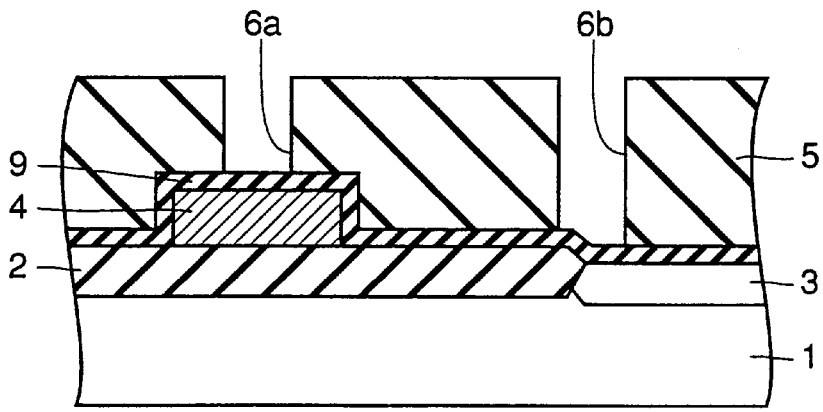
Figure 11:
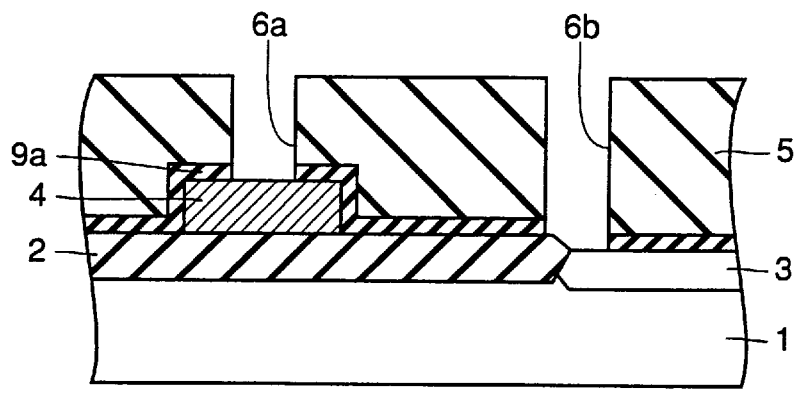

Referring to FIG. 10, contact hole 6a which reaches gate electrode 4 and the second contact hole 6b which reaches impurity diffusion layer 3 are formed in interlayer insulating film 5. Referring then to FIG. 11, etching stopper film 9 is removed at the bottom of each of the first and second contact holes 6a and 6b.

With this method, the surface of gate electrode 4 is not scraped in the portion of the first contact hole 6a. Furthermore, since the etch selectivity between etching stopper film 9 and LOCOS oxide film 2 is increased in the second contact hole 6b, an end of LOCOS oxide film 2 that overlaps with the second contact hole 6b, as shown in the figure, will not be etched and the second contact hole 6b will thus not reach silicon substrate 1. Accordingly, the distance between LOCOS oxide film 2 and the second contact hole 6b can be designed to be shorter than the margin for registration to effectively contemplate advantageous microfabrication.

Figure 24:
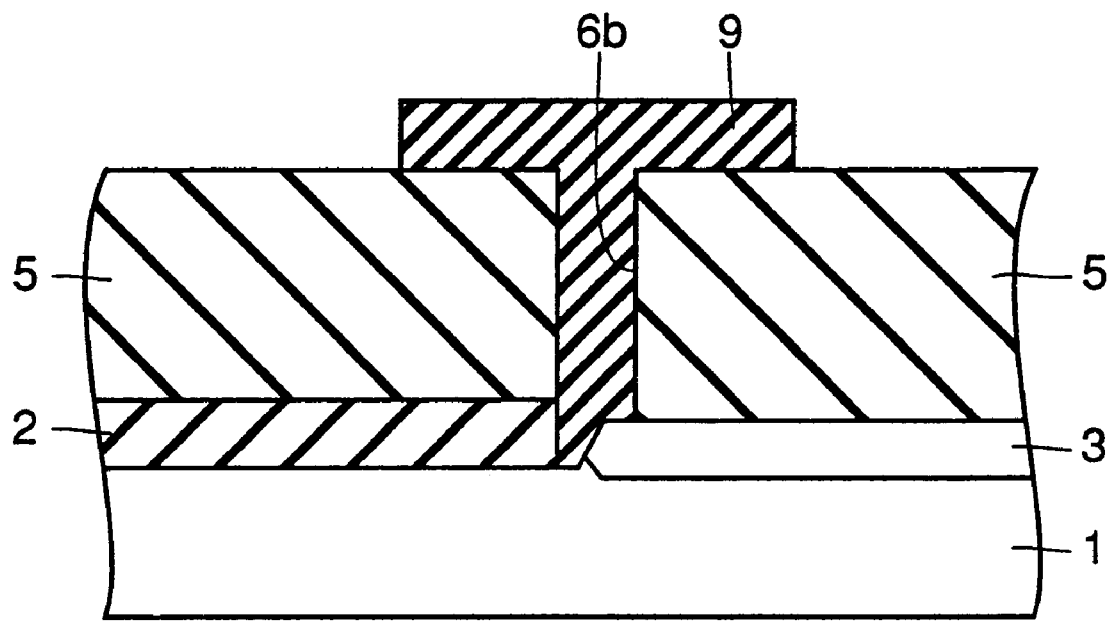

More specifically, conventional devices with LOCOS oxide film 2 less than 0.2 to 0.3 µm distant from the second contact hole 6b suffer from such leakage as shown in FIG. 24 if the second contact hole 6 is displaced in forming it. In contrast, the second embodiment is not subject to such leakage however short the distance between LOCOS oxide film 2 and the second contact hole 6b is.

Figure 12:
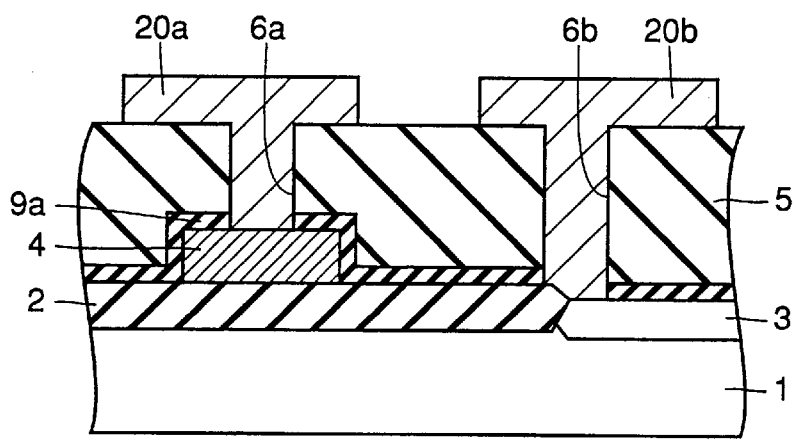

Referring to FIG. 12, an interconnection layer 20a connected to gate electrode 4 and an interconnection layer 20b connected to impurity diffusion layer 3 are formed to obtain the semiconductor device.

Figure 13:
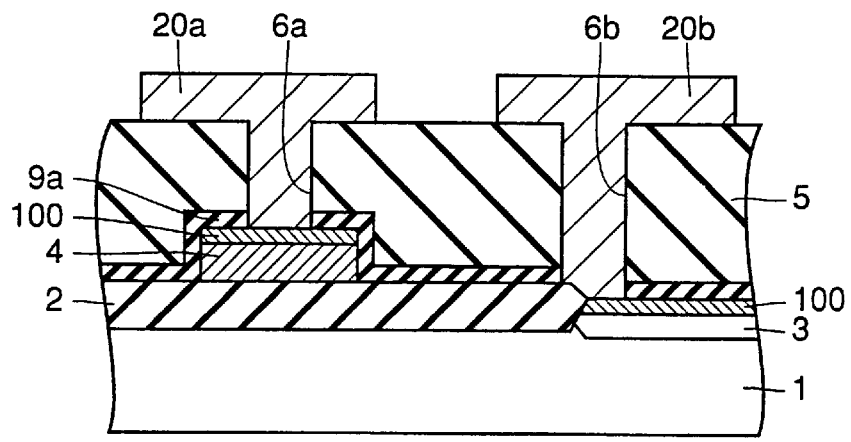
FIG. 13 is a cross section of the semiconductor device according to the second embodiment in another manner.

Referring to FIG. 13, a silicide 100 of refractory metal, such as Ti, Co, Ni, W, (self-aligned silicide: salicide) can also be formed at a surface of gate electrode 4 and a surface of impurity diffusion layer 3 to effectively contemplate low resistance.

Third Embodiment

Figure 14:
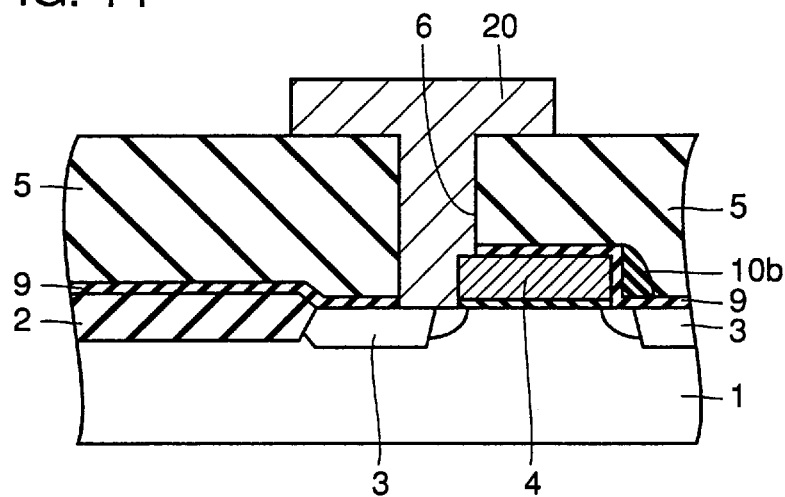
FIG. 14 is a cross section of a semiconductor device according to a third embodiment.

FIG. 14 is a cross section of a semiconductor device according to a third embodiment. The semiconductor device according to the third embodiment includes a silicon substrate 1. A LOCOS oxide film 2 is formed in a surface of silicon substrate 1. A gate electrode 4 is formed on silicon substrate 1. A pair of impurity diffusion layers 3 of an LDD structure is provided in a main surface of silicon substrate 1 to sandwich gate electrode 4. A stopper film 9 is provided on silicon substrate 1 such that stopper film 9 covers a surface of gate electrode 4. An interlayer insulating film 5 is provided on silicon substrate 1 with stopper film 9 interposed therebetween. Interlayer insulating film 5 and stopper film 9 are penetrated by a shared contact hole 6 which simultaneously exposes a portion of a surface of gate electrode 4 and a portion of a surface of impurity diffusion layer 3. Stopper film 9 is formed of a material higher in etch selectivity than interlayer insulating ($SiO_2$) film 5, such as silicon nitride film.

A method of manufacturing the semiconductor device according to the third embodiment will now be described.

Figure 15:
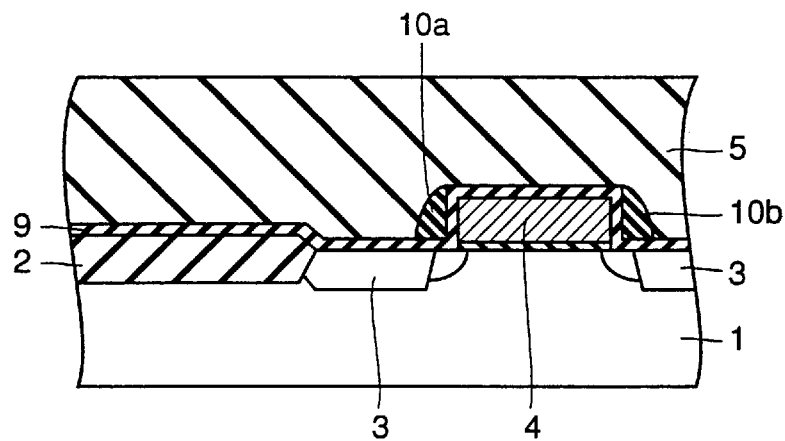
FIGS. 15–18 are cross sections of the semiconductor device according to the third embodiment in first to fourth steps of a method of manufacturing the semiconductor device according to the third embodiment.

Referring to FIG. 15, LOCOS oxide film 2 is formed at a surface of silicon substrate 1. Gate electrode 4 is formed on silicon substrate. Impurity diffusion layer 3 is formed at both sides of gate electrode 4. $SiO_2$-formed, sidewall spacers 10a, 10b formed at a sidewall of gate electrode 4 is used as a mask for injecting an impurity into a surface of silicon substrate 1 to form a pair of impurity diffusion layers 3 of an LDD structure. Interlayer insulating film 5 is formed on silicon substrate 1 to cover gate electrode 4.

Figure 16:
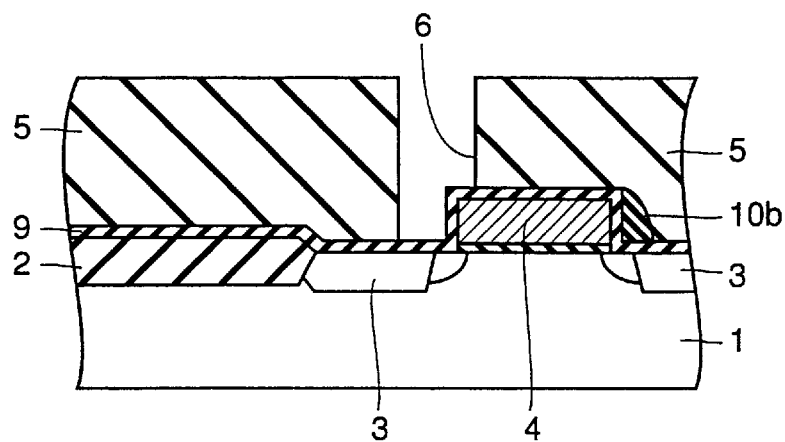

Referring to FIG. 16, shared contact hole 6 which simultaneously exposes a portion of a surface of gate electrode 4 and a portion of a surface of impurity diffusion layer 3 are formed in interlayer insulating film 5. Due to the presence of etching stopper film 9, sidewall spacer 10a in shared contact hole 6 can completely be removed without overetching gate electrode 4.

Figure 17:
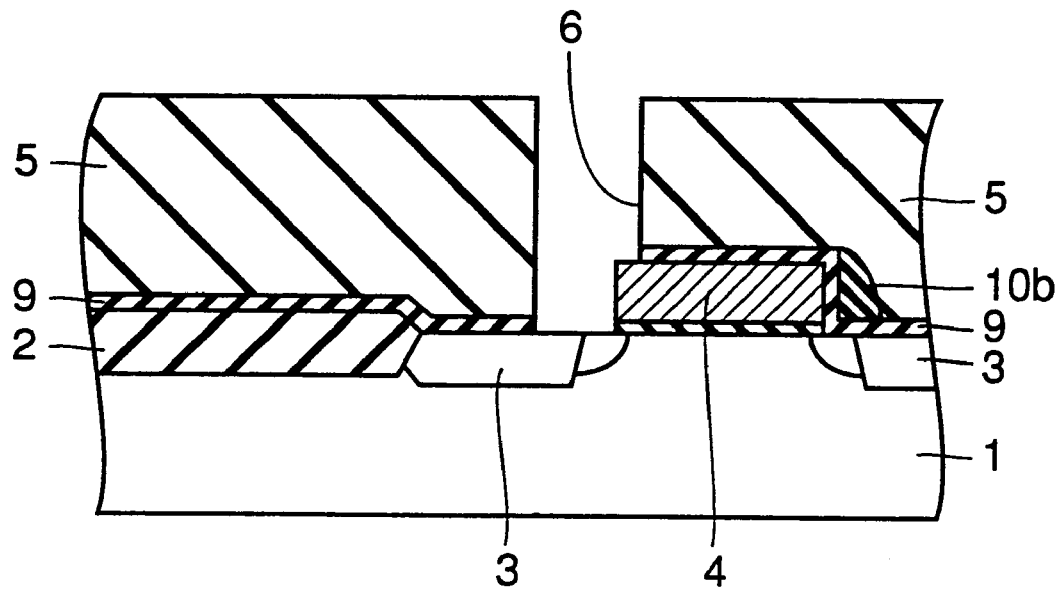
Figure 18:
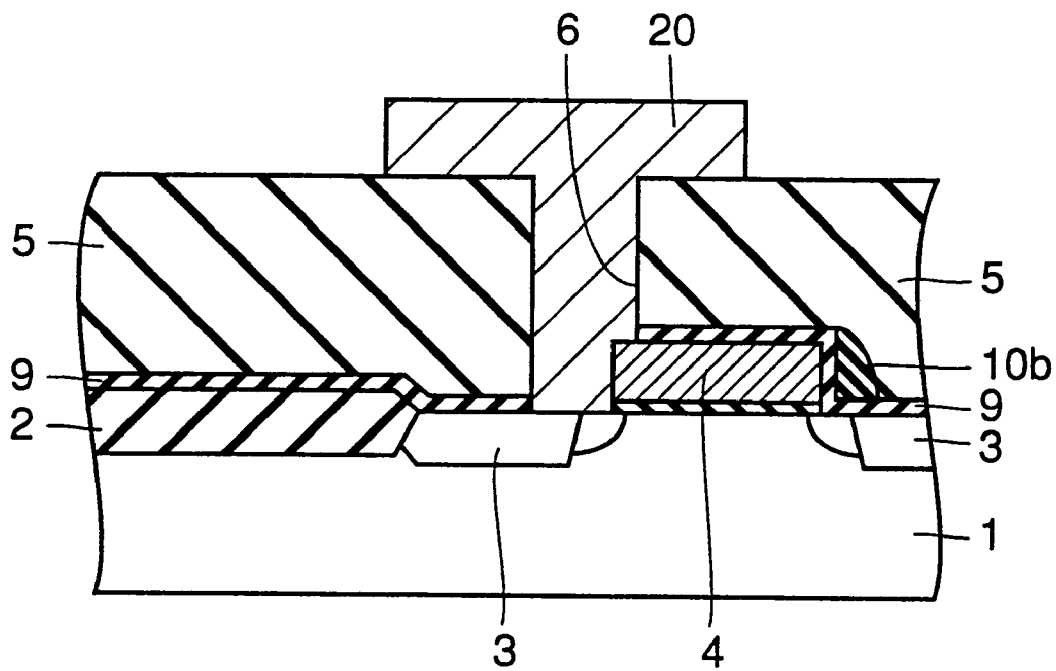

Referring to FIG. 17, etching stopper film 9 is etched away at the bottom of shared contact hole 6. Referring to FIG. 18, an interconnection layer connected to gate electrode 4 and to impurity diffusion layer 3 is formed on silicon substrate 1. Since a side surface of gate electrode 4 also contributes to electrical connection, a stable, shared contact can thus be provided. Furthermore, the size of shared contact hole 6 can also be reduced, which is effective in microfabrication. It should also be noted that since gate electrode 4 is not overetched, even a semiconductor device without sidewall spacer 10a still has the effect that the surface of gate electrode 4 is not scraped.

Fourth Embodiment

Figure 19:
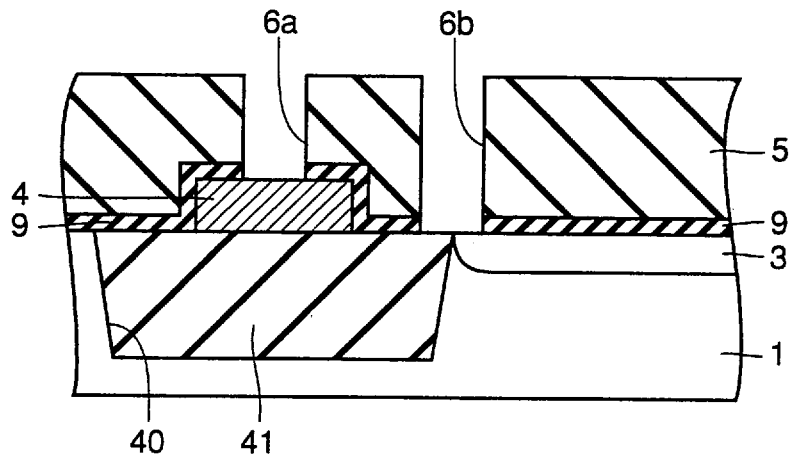
FIG. 19 is a cross section of a semiconductor device according to a fourth embodiment.
Figure 20:
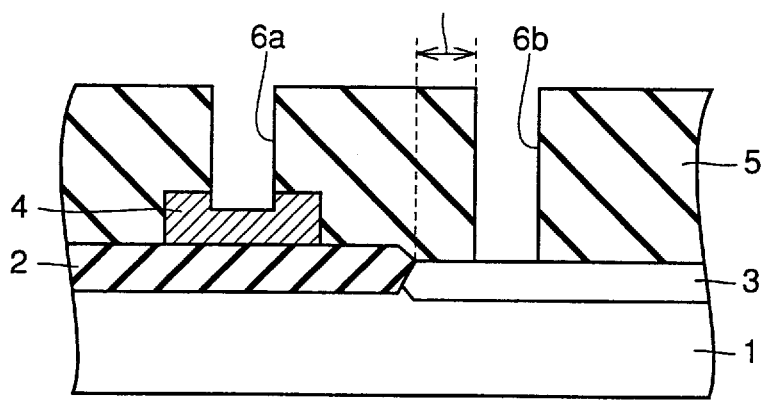
FIGS. 20–22 are cross sections of a conventional semiconductor device in first to third steps of a method of manufacturing the conventional semiconductor device.
Figure 21:
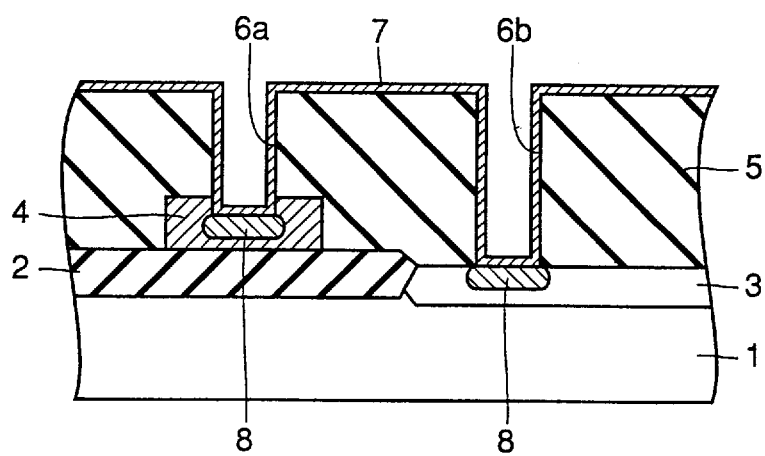
Figure 22:
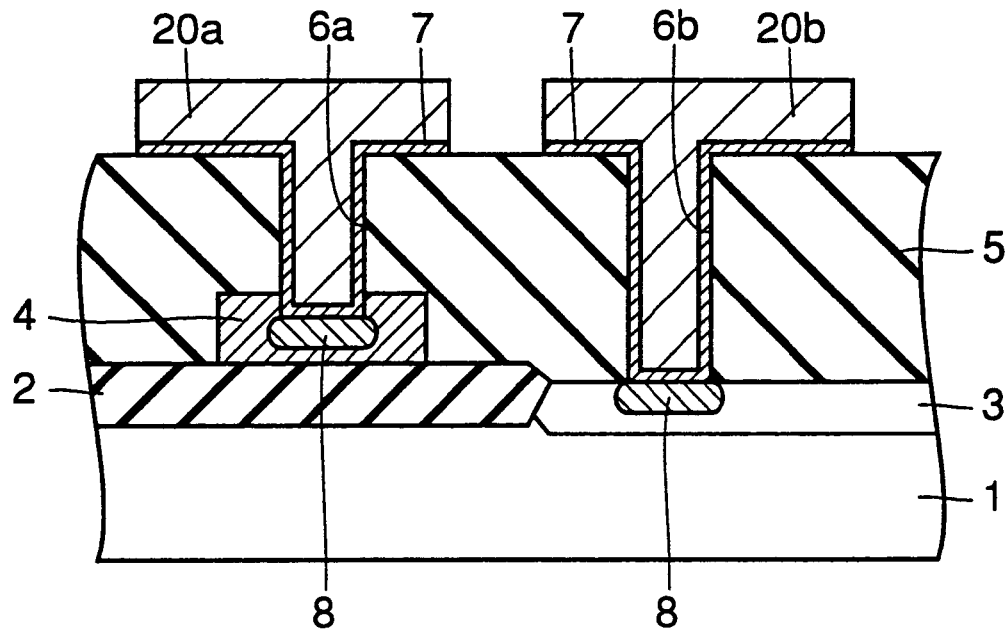
Figure 23:
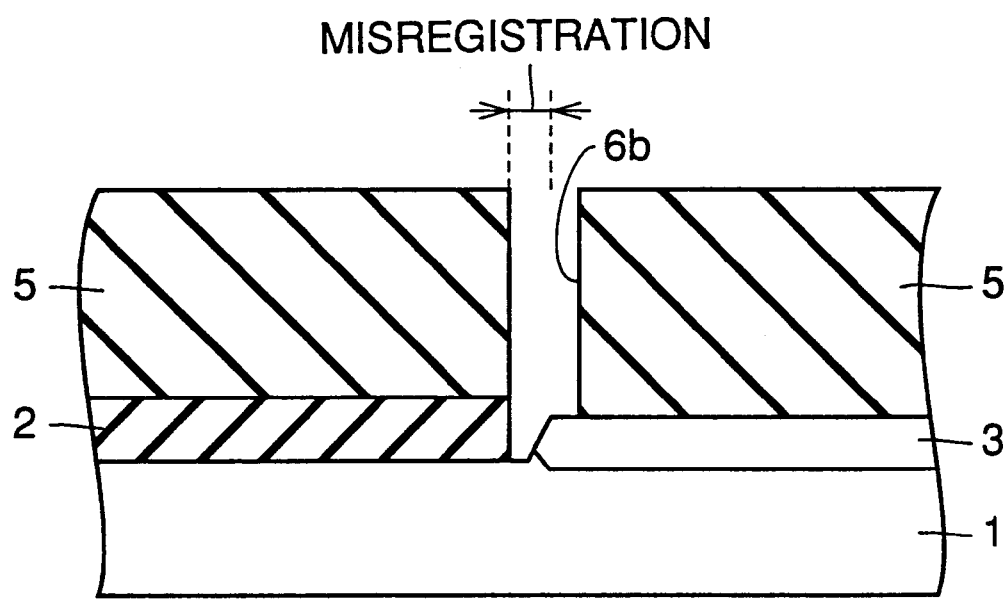
FIGS. 23 and 24 are cross sections of another conventional semiconductor device in first and second steps of a method of manufacturing the another conventional semiconductor device.

While the first to third embodiments show examples with an element isolating region formed of interlayer insulating film, the present invention is not limited to such examples and can be applied to a semiconductor device of trench separation type, as shown in FIG. 19.

The device shown in FIG. 19 is similar to that of the second embodiment except for the point described below, and thus identical or corresponding portions are labeled by identical reference characters and a description thereof will not be repeated.

The semiconductor device shown in FIG. 19 differs from the semiconductor device of the third embodiment in that the element isolating region is formed by trench separation. Referring to FIG. 19, the element isolating region is formed of a trench 40 formed at a surface of silicon substrate 1, and of a silicon oxide film 41 buried in trench 40. The semiconductor device with such a trench separation can also achieve an effect similar to those of the semiconductor devices according to the first to fourth embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate;

an element isolating region provided on said semiconductor substrate for isolating an active region from another active region;

an impurity diffusion layer provided at said active region;

a gate electrode provided on said semiconductor substrate;

a stopper film provided on said gate electrode;

an interlayer insulating film provided on said semiconductor substrate and covering said gate electrode;

a first contact hole penetrating said interlayer insulating film and said stopper film and exposing a surface of said gate electrode; and a second contact hole provided in said interlayer insulating film for exposing a surface of said impurity diffusion layer; wherein said stopper film is formed of a material higher in etch selectivity than said interlayer insulating film.

2. A semiconductor device comprising:

a semiconductor substrate;

an element isolating region provided on said semiconductor substrate for isolating an active region from another active region;

an impurity diffusion layer provided at said active region;

a gate electrode provided on said semiconductor substrate;

a stopper film provided on said semiconductor substrate and covering said gate electrode and said impurity diffusion layer;

an interlayer insulating film provided on said semiconductor substrate with said stopper film interposed therebetween; and a first contact hole penetrating said interlayer insulating film and said stopper film and exposing a surface of said impurity diffusion layer; wherein said stopper film is formed of a material higher in etch selectivity than said interlayer insulating film.

3. The semiconductor device according to claim 2, further comprising a second contact hole penetrating said interlayer insulating film and said stopper film and exposing a surface of said gate electrode.

4. The semiconductor device according to claim 1, wherein said element isolating region is formed of LOCOS oxide film formed at a surface of said semiconductor substrate.

5. The semiconductor device according to claim 1, wherein said element isolating region is formed of a trench formed at a surface of said semiconductor substrate and an oxide film buried in said trench.

6. The semiconductor device according to claim 1, wherein said gate electrode is formed of a polycide of refractory metal.

7. The semiconductor device according to claim 1, wherein a silicide of refractory metal is formed on said gate electrode and said impurity diffusion layer.

8. The semiconductor device according to claim 1, wherein said gate electrode is formed on said element isolating region.

9. A method of manufacturing a semiconductor device with a contact hole provided in an interlayer insulating film, comprising the steps of:

forming on a semiconductor substrate an element isolating region for isolating an active region from another active region;

forming an impurity diffusion layer at said active region;

forming a gate electrode on said element isolating region;

forming on said semiconductor substrate a stopper film formed of a material higher in etch selectivity than said interlayer insulating film and covering said gate electrode and said impurity diffusion layer;

forming on said semiconductor substrate said interlayer insulating film covering said stopper film;

forming a first contact hole in said interlayer insulating film adjacent to a boundary of said element isolating region and said active region and over said impurity diffusion layer, for exposing a surface of said stopper film; and etching away said stopper film exposed by said first contact hole to expose a surface of said impurity diffusion layer.

10. The method of manufacturing a semiconductor device according to claim 9, wherein said contact hole is formed less than 0.2 $\mu$m distant from a boundary of said element isolating region and said active region.

11. The method of manufacturing a semiconductor device according to claim 9, comprising the step of forming a second contact hole in said interlayer insulating film over said gate electrode for exposing a surface of said stopper film simultaneously with formation of said first contact hole.

12. The method of manufacturing a semiconductor device according to claim 9, wherein said element isolating region is formed of LOCOS oxide film provided at a surface of said semiconductor substrate.

13. The method of manufacturing a semiconductor device according to claim 9, wherein said element isolating region is formed of a trench formed at a surface of said semiconductor substrates and of an oxide film buried in said trench.

* * * * *